United States Patent
Melde

(10) Patent No.: US 11,600,628 B2
(45) Date of Patent: Mar. 7, 2023

(54) FLOATING GATE MEMORY CELL AND MEMORY ARRAY STRUCTURE

(71) Applicant: GLOBALFOUNDRIES U.S. Inc., Santa Clara, CA (US)

(72) Inventor: Thomas Melde, Dresden (DE)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 128 days.

(21) Appl. No.: 16/743,070

(22) Filed: Jan. 15, 2020

(65) Prior Publication Data
US 2021/0217758 A1 Jul. 15, 2021

(51) Int. Cl.
| | |
|---|---|
| *H01L 27/11524* | (2017.01) |
| *H01L 29/66* | (2006.01) |
| *H01L 29/788* | (2006.01) |
| *H01L 29/423* | (2006.01) |
| *H01L 21/28* | (2006.01) |
| *H01L 21/762* | (2006.01) |
| *H01L 29/51* | (2006.01) |

(52) U.S. Cl.
CPC .. *H01L 27/11524* (2013.01); *H01L 21/76283* (2013.01); *H01L 29/40114* (2019.08); *H01L 29/42328* (2013.01); *H01L 29/513* (2013.01); *H01L 29/518* (2013.01); *H01L 29/66825* (2013.01); *H01L 29/7881* (2013.01)

(58) Field of Classification Search
CPC ......... H01L 27/11524; H01L 27/11536; H01L 27/1157; H01L 27/1203; H01L 21/28273; H01L 21/28282; H01L 21/76283; H01L 29/0649; H01L 29/40114; H01L 29/42328; H01L 29/4234; H01L 29/513; H01L 29/518; H01L 29/66825; H01L 29/66833; H01L 29/788; H01L 29/7881; H01L 29/42344; H01L 27/1207; H01L 29/42336
See application file for complete search history.

(56) References Cited

U.S. PATENT DOCUMENTS

| | | | |
|---|---|---|---|
| 6,355,523 B1 * | 3/2002 | Maurelli | H01L 29/7885 438/257 |
| 6,614,684 B1 | 9/2003 | Shukuri et al. | |
| 7,548,460 B2 | 6/2009 | Diorio et al. | |
| 8,222,696 B2 * | 7/2012 | Yamazaki | H01L 29/7881 257/347 |
| 9,780,231 B1 * | 10/2017 | Li | H01L 29/0649 |
| 9,842,845 B1 * | 12/2017 | Melde | H01L 21/31111 |
| 9,871,050 B1 * | 1/2018 | Richter | H01L 27/1207 |
| 9,972,634 B2 * | 5/2018 | Richter | H01L 27/11546 |

(Continued)

*Primary Examiner* — Maliheh Malek
(74) *Attorney, Agent, or Firm* — Yee Tze Lim; Hoffman Warnick LLC

(57) ABSTRACT

Embodiments of the disclosure provide a floating gate memory cell, including: a silicon-on-insulator (SOI) substrate, the SOI substrate including a semiconductor bulk substrate, a buried oxide layer formed on the semiconductor bulk substrate, and a semiconductor layer formed on the buried oxide layer; a memory device, including: a control gate formed in the semiconductor layer of the SOI substrate; an insulating layer formed on the control gate; and a floating gate formed on the insulating layer; and a transistor device electrically connected to the memory device. The transistor device includes an active region formed in the semiconductor layer of the SOI substrate.

14 Claims, 11 Drawing Sheets

(56) References Cited

U.S. PATENT DOCUMENTS

| | | | |
|---|---|---|---|
| 10,199,259 B1* | 2/2019 | Smith | H01L 21/76229 |
| 10,199,385 B1* | 2/2019 | Li | H01L 29/792 |
| 11,031,406 B2* | 6/2021 | Smith | H01L 21/02381 |
| 11,037,821 B2* | 6/2021 | Yang | H01L 21/76816 |
| 11,069,402 B1* | 7/2021 | Jaiswal | G11C 16/0408 |
| 11,380,373 B1* | 7/2022 | Nour | G11C 11/2273 |
| 11,450,678 B2* | 9/2022 | Zang | H01L 29/42328 |
| 2003/0151112 A1* | 8/2003 | Yamada | H01L 27/10861 257/E21.654 |
| 2004/0023499 A1* | 2/2004 | Hellig | H01L 21/76816 438/694 |
| 2005/0227435 A1* | 10/2005 | Oh | H01L 29/66795 438/257 |
| 2007/0012988 A1* | 1/2007 | Bhattacharyya | H01L 27/11524 257/314 |
| 2007/0076482 A1* | 4/2007 | Kato | H01L 29/42336 365/185.14 |
| 2007/0128815 A1* | 6/2007 | Iino | H01L 27/115 257/314 |
| 2007/0218632 A1* | 9/2007 | Chung | H01L 27/11521 257/E21.422 |
| 2007/0284649 A1* | 12/2007 | Iwasawa | H01L 27/115 257/E21.279 |
| 2009/0090954 A1* | 4/2009 | Yamazaki | H01L 29/78675 257/E29.17 |
| 2009/0134468 A1* | 5/2009 | Tsuchiya | H03K 17/6872 257/E27.06 |
| 2012/0261740 A1* | 10/2012 | Cai | H01L 29/7391 257/E21.409 |
| 2013/0175594 A1* | 7/2013 | Basker | H01L 27/10861 438/155 |
| 2014/0335663 A1* | 11/2014 | Niebojewski | H01L 29/66636 438/151 |
| 2014/0353740 A1* | 12/2014 | Nishida | H01L 27/11573 257/326 |
| 2015/0123190 A1* | 5/2015 | Chou | H01L 27/11531 257/321 |
| 2015/0206592 A1* | 7/2015 | Goda | H01L 27/11546 365/185.02 |
| 2015/0311221 A1* | 10/2015 | Huang | H01L 21/76855 257/314 |
| 2016/0013197 A1* | 1/2016 | Liu | H01L 29/42344 438/593 |
| 2017/0103989 A1* | 4/2017 | Su | H01L 27/11531 |
| 2017/0345834 A1 | 11/2017 | Melde | |
| 2018/0012996 A1* | 1/2018 | Baldauf | B82Y 40/00 |
| 2018/0047738 A1* | 2/2018 | Richter | H01L 27/11546 |
| 2018/0108668 A1* | 4/2018 | Richter | H01L 29/42336 |
| 2018/0158835 A1* | 6/2018 | Richter | H01L 29/78654 |
| 2018/0233509 A1* | 8/2018 | Cai | H01L 29/42336 |
| 2018/0269209 A1* | 9/2018 | Tan | H01L 21/84 |
| 2019/0043992 A1* | 2/2019 | Sun | H01L 29/66825 |
| 2019/0115354 A1* | 4/2019 | Tan | H01L 29/42324 |
| 2020/0035304 A1* | 1/2020 | Tailliet | H01L 27/11517 |
| 2020/0227523 A1* | 7/2020 | Leipold | H01L 29/66977 |
| 2021/0055256 A1* | 2/2021 | Cai | G01N 27/4148 |
| 2021/0151451 A1* | 5/2021 | Zang | H01L 27/11556 |
| 2022/0223740 A1* | 7/2022 | Melde | H01L 27/11524 |

* cited by examiner

FLOATING GATE MEMORY CELL AND MEMORY ARRAY STRUCTURE

BACKGROUND

The present disclosure relates to semiconductor devices and integrated circuits, and more specifically to a floating gate memory cell and associated high density memory array structure.

Flash memory (for example, a flash erasable programmable read-only memory (EPROM) or flash electrically erasable programmable read-only memory (EEPROM) is a semiconductor device that is formed from an array of memory cells, with each memory cell having a floating gate transistor. Each floating gate transistor includes a source, drain, floating gate, and control gate. The sources of each floating gate in each cell in a row of the array are connected to form a source line. To enable the individual memory elements of a flash memory chip to maintain the physical state with which they have been programmed, each memory region must be isolated from its neighboring regions, typically by shallow trench isolations.

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a complementary metal oxide semiconductor (CMOS) device, a single chip device can be manufactured and configured for a variety of applications. To combine non-volatile memory (such as flash EEPROM) into a standard CMOS process flow, many additional processing steps (and associated costs) are typically added to the standard CMOS process in order to construct the required additional device features (such as a floating gate or control gate) along with other system components.

SUMMARY

A first aspect of the disclosure is directed to a method of manufacturing a floating gate memory cell, including: forming a memory device on a silicon-on-insulator (SOI) substrate, the SOI substrate including a semiconductor bulk substrate, a buried oxide layer formed on the semiconductor bulk substrate, and a semiconductor layer formed on the buried oxide layer, wherein forming the memory device includes: forming a control gate in the semiconductor layer of the SOI substrate; forming an insulating layer on the control gate; and forming a floating gate on the insulating layer.

A second aspect of the disclosure includes a floating gate memory cell, including: a silicon-on-insulator (SOI) substrate, the SOI substrate including a semiconductor bulk substrate, a buried oxide layer formed on the semiconductor bulk substrate, and a semiconductor layer formed on the buried oxide layer; a memory device, including: a control gate formed in the semiconductor layer of the SOI substrate; an insulating layer formed on the control gate; and a floating gate formed on the insulating layer; and a transistor device electrically connected to the memory device.

A third aspect of the disclosure provides a memory array, including: a plurality of floating gate memory cells, each floating gate memory cell including: a silicon-on-insulator (SOI) substrate, the SOI substrate comprising a semiconductor bulk substrate, a buried oxide layer formed on the semiconductor bulk substrate, and a semiconductor layer formed on the buried oxide layer; a memory device, including: a control gate formed in the semiconductor layer of the SOI substrate; an insulating layer formed on the control gate; and a floating gate formed on the insulating layer; and an active area electrically connected to the memory device.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

Figure 2:
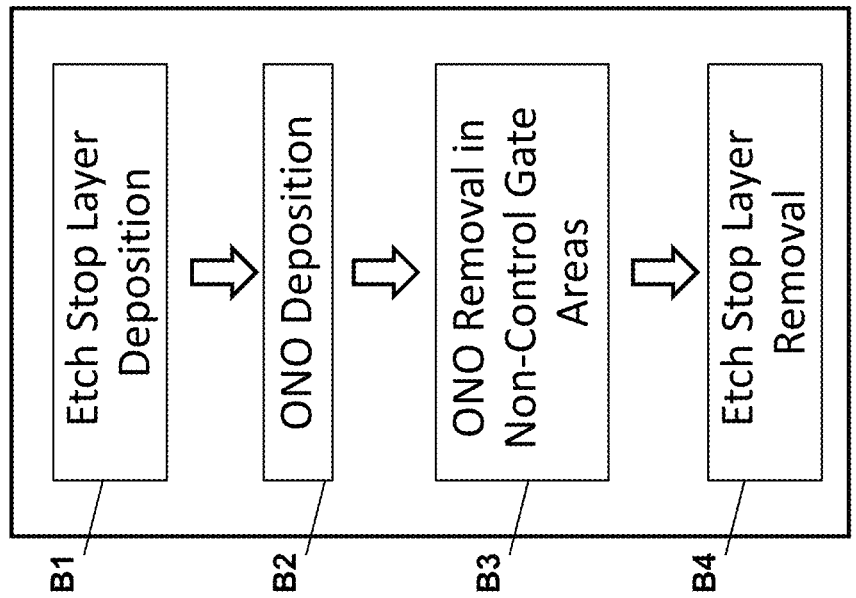
FIGS. 1 and 2 depict semiconductor processing flow diagrams of processes for forming a semiconductor device according to various embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Generally, manufacturing techniques and semiconductor devices in which n-channel transistors and/or p-channel transistors and memory cells may be formed are described herein. The manufacturing techniques may be integrated in CMOS manufacturing processes. As will be readily apparent to those skilled in the art upon a complete reading of the present disclosure, the present method is applicable to a variety of technologies, and is readily applicable to a variety of devices, including, but not limited to, logic devices, memory devices, static random access memory (SRAM) devices, etc. The techniques and technologies described herein may be utilized to fabricate MOS-type integrated circuit devices. In particular, the process steps described herein may be utilized in conjunction with any semiconductor device fabrication process that forms gate structures for integrated circuits, including both planar and non-planar integrated circuits.

The present disclosure, generally, provides techniques for the formation of logic devices and memory cells within, for example, fully-depleted silicon-on-insulator (FD-SOI) processing. In particular, in one example, a manufacturing technique of a memory device (cell) integrated in the process flow of the formation of a $SiO_2$ dielectric-poly gate field-effect transistor (FET) or a high-k dielectric-metal-poly gate FET is provided. The memory cell may be or include a flash memory, a floating gate memory cell, a flash EPROM or a flash EEPROM, etc.

Figure 1:
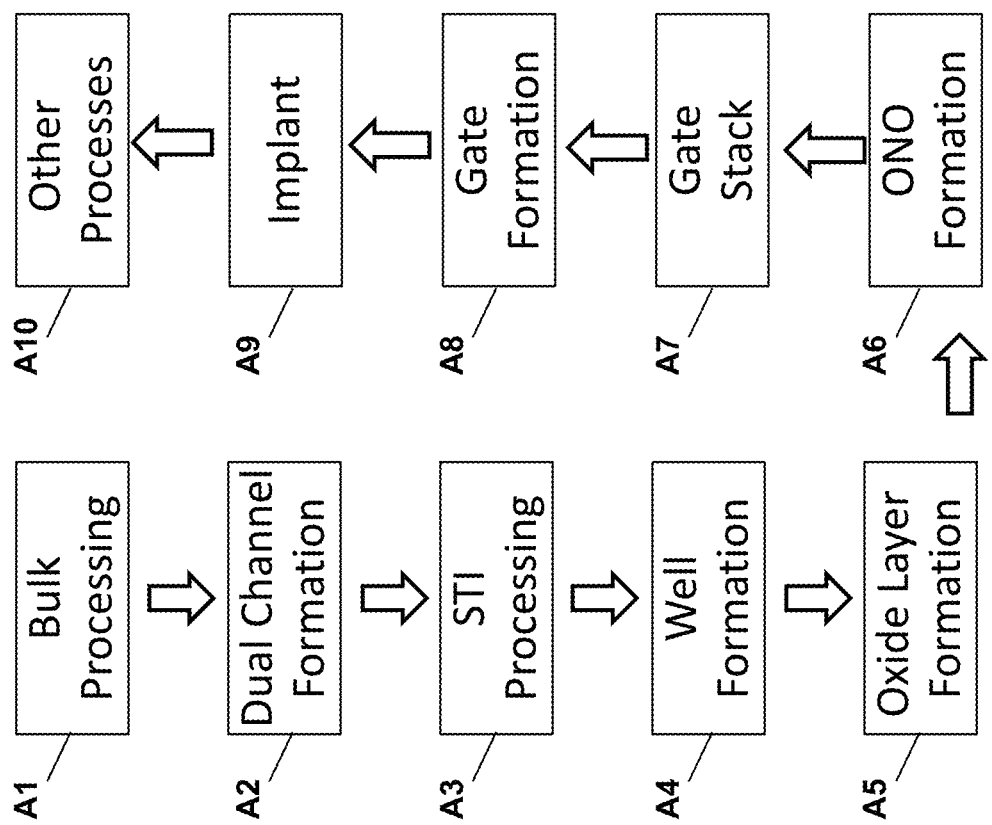

FIGS. 1 and 2 include flow charts of example manufacturing techniques that may be employed to form a memory cell comprising a plurality of memory devices and transistor devices. Some, all, or additional processes may be employed to form a floating gate memory cell and associated high density array structure as disclosed herein.

A silicon-on-insulator (SOI) substrate may be provided by appropriate bulk processing at process A1. The SOI substrate may include a bulk semiconductor layer, a buried oxide (BOX) layer formed on the bulk semiconductor layer, and a semiconductor layer (or so-called active layer) formed on the BOX layer. The semiconductor layer may include silicon (Si) or other suitable semiconductor materials, for instance, a silicon-based material containing other iso-electronic components, such as germanium, carbon, silicon/germanium, silicon/carbon, other II-VI or III-V semiconductor compounds, and the like.

The BOX layer of the SOI substrate may include silicon dioxide ($SiO_2$), a borosilicate glass, a borophosphosilicate glass (BPSG), and the like. The BOX layer may be composed of different layers formed, for example, of BPSG or an $SiO_2$-compound comprising boron or phosphorus. The bulk semiconductor layer may include silicon, in particular, single crystal silicon. Other materials may be used to form the bulk semiconductor layer such as, for example, germanium, silicon germanium, gallium phosphate, gallium arsenide, etc.

Dual channel formation may be performed process A2 to form the channel regions of n-channel and p-channel transistor devices. In principle, the dual channel formation may include the formation of stressed semiconductor materials, for example, silicon germanium, on and/or in the SOI substrate, as is known in the art.

Shallow trench isolation (STI) processing may be performed at process A3 to form a plurality of shallow trench isolation (STI) regions. An STI separates a region designated for the formation of a logic device, particularly, a FET, e.g., a logic region, from a region designated for the formation of a memory cell, e.g., a (flash) memory region. The STI regions may be formed by etching openings through the semiconductor layer and the BOX layer of the SOI substrate and in the bulk semiconductor layer and filling the openings using an insulating material, for example, an oxide material.

Well formation may be performed at process A4 in the bulk semiconductor layer by appropriate implantation of n-type and p-type dopants. An oxide layer may be formed at process A5 over the SOI substrate. The oxide layer may be formed, for example by thermal oxidation or by an atmospheric or low pressure chemical vapor deposition (LPCVD) process, and it may include a high-voltage oxide functioning as a gate dielectric and/or a tunnel oxide.

According to the present disclosure, oxide-nitride-oxide (ONO) formation may be performed at process A6 before gate stack formation at process A7. The ONO formation results in the formation of an isolation layer over the SOI substrate that is provided in order to enhance the capacitive coupling between a floating gate and a control gate of a memory device to be formed.

Some details of the ONO formation of process A6 are depicted in FIG. 2. The ONO formation may include deposition of an etch stop layer at process B1 followed by the deposition of the ONO layer at process B2 over the SOI substrate. Subsequently, the ONO layer is removed at process B3 from all regions of the logic region and the memory region with the exception of the region where a control gate of the memory device is to be formed. Removal of the ONO layer is facilitated by the etch stop layer. Subsequently, the etch stop layer may be removed at process B4. However, usage of the etch stop layer is merely optional.

Referring again to FIG. 1, multilayer gate stack formation may be performed at process A7 after completion of the ONO formation at process A6. The gate stack formation provides for the formation of a gate electrode of a transistor device in a logic region as well as gates of the memory device in the memory region. In particular, in the logic region, the gate stack formation may include the formation of a high-k dielectric layer, which may include a transitional metal oxide, such as at least one of hafnium oxide, hafnium dioxide, and hafnium silicon-oxynitride. A work function adjusting layer may be formed on the high-k dielectric layer and may include titanium nitride (TiN) or any other appropriate work function adjusting metal or metal oxide known in the art. The gate stack, furthermore, may include a metal gate layer and/or a polysilicon layer.

By appropriate photolithography processing and etching, a gate may be formed at process A8 from the gate stack. Sidewall spacers may be formed at sidewalls of the (logic) gate. The sidewall spacers may include, for example, silicon dioxide and/or silicon nitride. The sidewall spacers may be provided in the form of multilayers by subsequently epitaxially growing or depositing the respective layers on the sidewalls of the gate and appropriately etching them.

Some post gate processing may be performed at process A9 including the implantation of dopants, and annealing processes to form source/drain regions, source/drain extension regions, etc., may follow. Other processes including silicidation of source/drain regions and/or the logic gate and Back-End-of-Line (BEOL) processing may follow at process A10.

Semiconductor devices that may be formed in accordance with the above-described exemplary process flow are illustrated in FIGS. 3-8.

Figure 3:
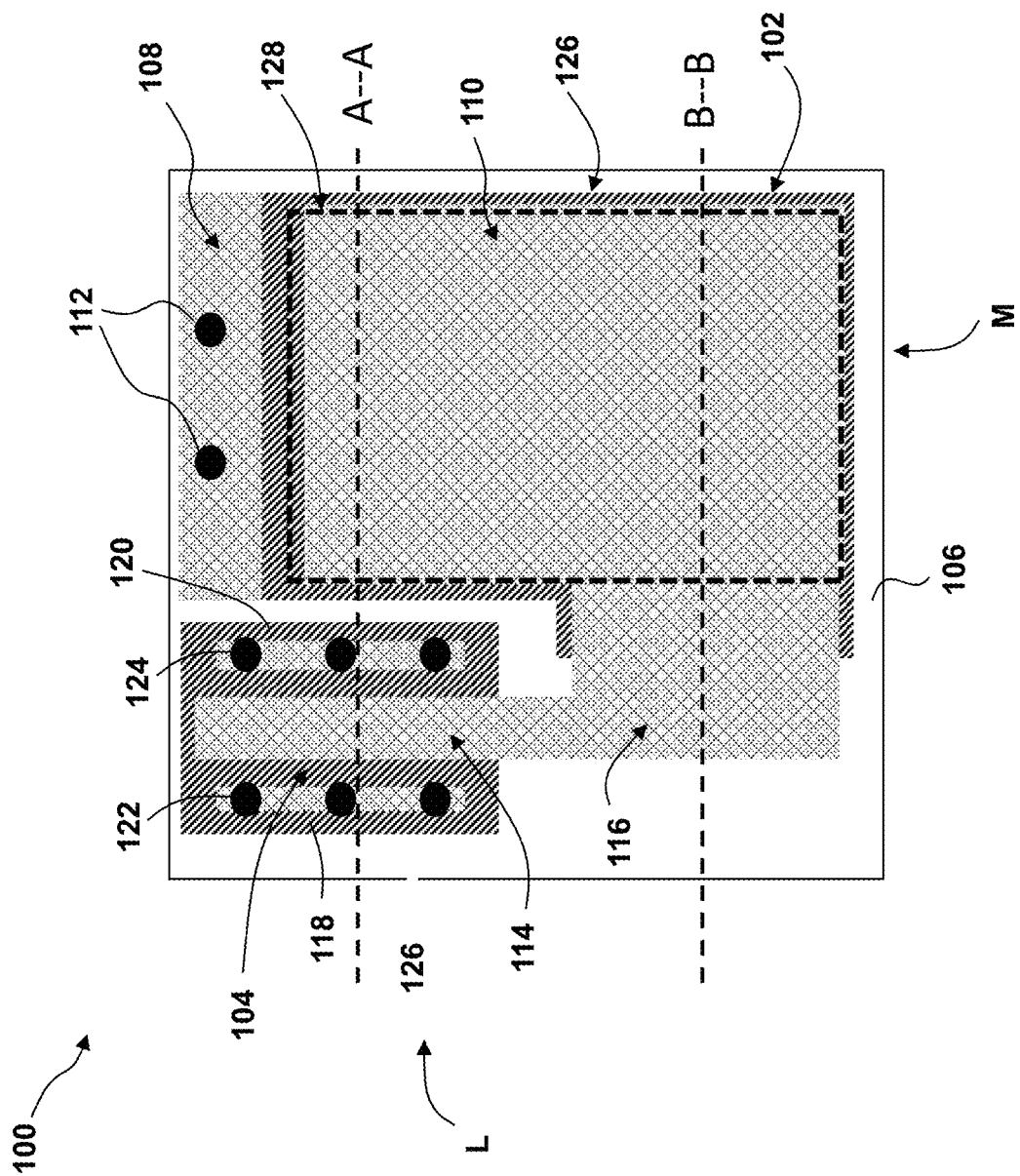
FIG. 3 is a plan view of a semiconductor device including a floating gate memory cell according to embodiments of the disclosure.

A plan view of a semiconductor device 100 including a floating gate memory cell according to embodiments is depicted in FIG. 3. The device 100 may include a memory region M including a flash memory device 102 and a logic region L including a transistor device 104 (e.g., a FET) surrounded by an isolation layer that may be a BOX layer 106 of an SOI substrate. The memory device 102 may further include a control gate 108 and a floating gate 110. Advantageously, according to embodiments and as described in further detail below, both the control gate 108 and the transistor device 104 may be formed using the silicon layer of an SOI substrate. In addition, the floating gate 110 and the read/write gate 114, both of which may be formed of polysilicon, may be formed during the same processing phases (e.g., gate stack formation (e.g., processes A7 and A8, FIG. 1)). The control gate 108 may be coupled to a wordline (not shown in FIG. 3) via wordline/control contacts 112. The wordline/control contacts 112, as well as all other electrical contacts disclosed herein, may be formed of a conductive material and may include, for example, aluminum or tungsten.

The device 100 illustrated in FIG. 3 may further include a read/write gate 114. The read/write gate 114, which may be formed, for example, of polysilicon, may be electrically coupled to the floating gate 110 via an electrode 116. The electrode 116 and other electrodes described herein may be formed using any suitable electrically conducting material including, for example, nickel monosilicide (SiNi). The transistor device 104, furthermore, may include a source region 118 and a drain region 120, which may be formed, for example, using a silicon layer of an SOI substrate. The source region 118 may be electrically connected to a source line (not shown in FIG. 3) by source contacts 122. The drain region 120 may be electrically connected to a bitline (not shown in FIG. 3) by bitline contacts 124.

According to embodiments, the control gate 108 of the memory device 102 may be formed using a silicon layer 126 of an SOI substrate. For example, the silicon layer 126 may be formed on a BOX layer 106 that is formed on a bulk semiconductor layer (see also description with reference to FIGS. 4 and 5 below). The transistor device 104 may also be formed using the same silicon layer 126. An ONO layer 128 may be used to isolate the floating gate 110, which is formed over the control gate 108, from the control gate 108.

Figure 4:
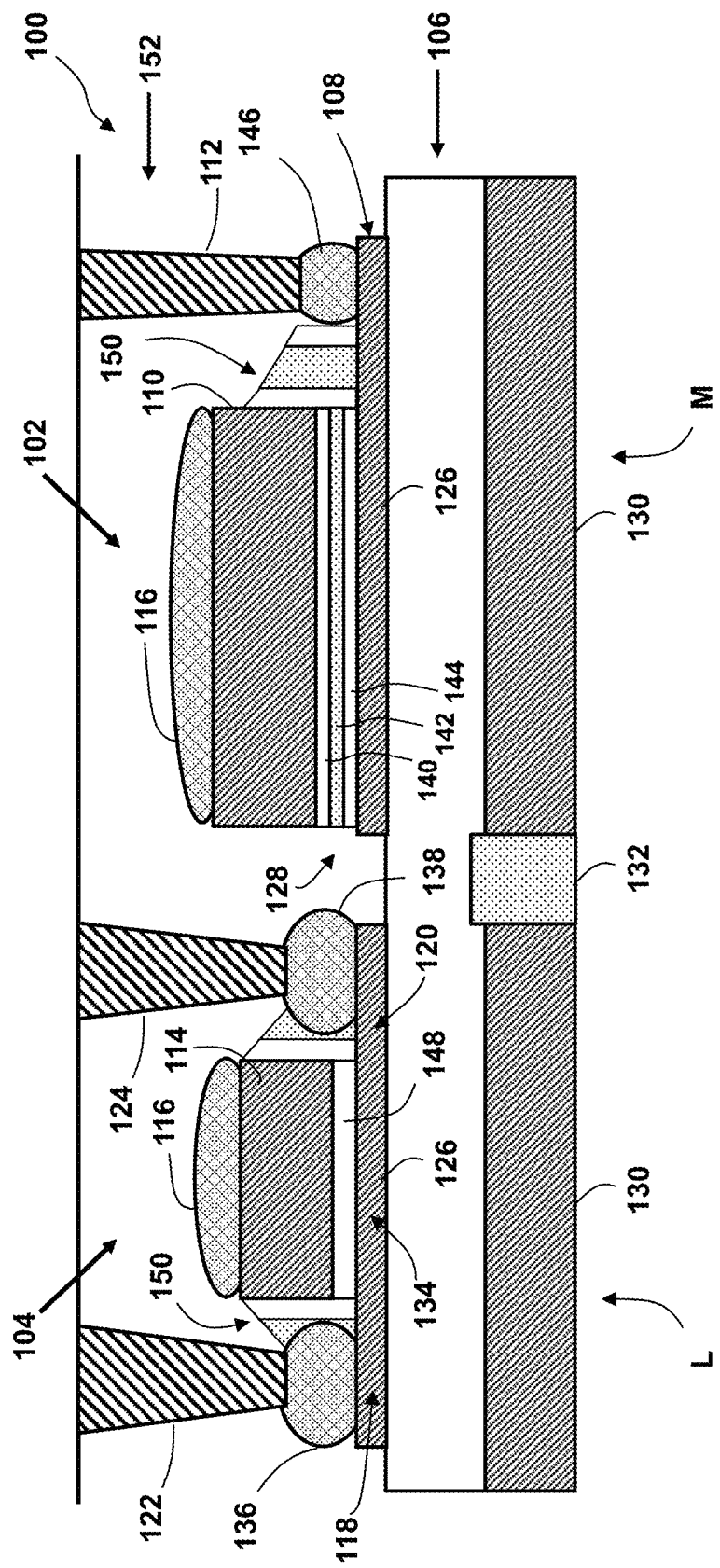
FIGS. 4 and 5 are cross-sectional views of a semiconductor device including a floating gate memory cell taken along the lines A-A and B-B of FIG. 3, respectively, according to embodiments of the disclosure.
Figure 5:
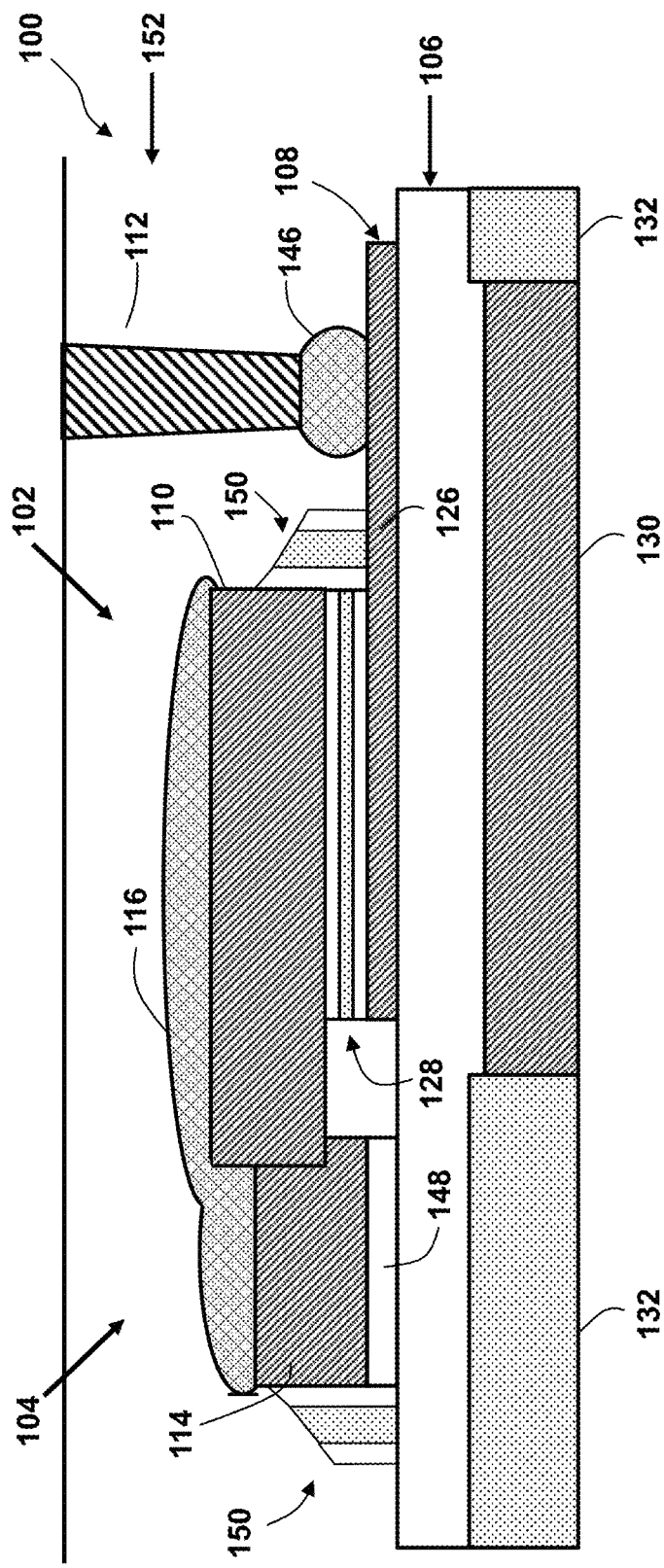

FIGS. 4 and 5 show cross-sectional views of the semiconductor device 100 taken along the lines A-A and B-B of FIG. 3, respectively. The device 100 may include a memory region M where the memory device 102 is formed and a logic region L where the transistor device 104 is formed. The device 100 may be formed on an SOI substrate including a bulk semiconductor layer 130, a BOX layer 106, and a silicon layer 126.

The bulk semiconductor layer 130 may include silicon, in particular, single crystal silicon. Other materials may be used to form the bulk semiconductor layer 130 such as, for example, germanium, silicon germanium, gallium phosphate, gallium arsenide, etc. The BOX layer 106 may include borophosphosilicate glass (BPSG) or an SiO$_2$-compound including boron or phosphorus. The semiconductor layer 126 may include silicon, in particular, crystalline silicon. Moreover, shallow trench isolation STI regions 132 for electrical insolation may be formed by etching openings through the semiconductor layer 126 and the BOX layer 106 of the SOI substrate and into the bulk semiconductor layer 130 and filling the opening by a suitable insulating material, for example, an oxide material. It is noted that the bulk semiconductor layer 130 may be used as a back gate in both the memory device 102 and the transistor device 104.

According to embodiments of the disclosure, a portion of the semiconductor layer 126 formed in the memory region M may be used to provide the control gate 108 of the memory device 102. In addition, a portion of the semiconductor layer 126 in the logic region L may be used to provide a source region 118, a drain region 120, and a channel region 134 of the transistor device 104. The source region 118 and drain region 120 may be formed by appropriate doping of the semiconductor layer 126. An electrode 136 may be provided to couple the source region 118 of the transistor device 104 to a source line (not shown) via a source contact 122. Similarly, an electrode 138 may be provided to couple the drain region 120 of the transistor device 104 to a bitline (not shown) via a bitline contact 124. The electrodes 136 and 138 may be formed for example by epitaxial growth of Si, which may also include dopants such as boron or phosphorus.

In the memory region M, an ONO layer 128 may be formed on the semiconductor layer 126 (the control gate 108) in the memory device 102. The ONO layer 128 may include, for example, a first oxide layer 140, a nitride layer 142, and a second oxide layer 144.

The floating gate 110, which may be formed, for example, of polysilicon, may be formed on the ONO layer 128. An electrode 116 may be formed on a surface of the floating gate 110. Additionally, an electrode 146 may be formed for example by epitaxial growth on a surface of the control gate 108. The control gate 110 may be coupled to a wordline (not shown) via the electrode 146 and wordline/control gate contact(s) 112.

The transistor device 104 of the semiconductor device 100 may include a gate dielectric 148 over which a read/write gate 114 is formed. The read/write gate 114 may be formed, for example, using polysilicon or other suitable material(s). As shown most clearly in FIGS. 3 and 5, the electrode 116, in addition to contacting the floating gate 110, may be formed so as to also contact the read/write gate 114. To this extent, the electrode 116 electrically connects the read/write gate 114 to the floating gate 110. According to embodiments, a unitary electrode 116 may be formed. In other embodiments, a plurality of electrode segments can be formed and connected together to form the electrode 116.

FIGS. 4 and 5 also show sidewall spacers 150 that may be formed on sidewalls of the read/write gate 114 and the floating gate 110. Further, the semiconductor device 100 shown in FIGS. 4 and 5 may include an interlayer dielectric 152. The interlayer dielectric 152 may be formed of an oxide material such as silicon dioxide.

Figure 6:
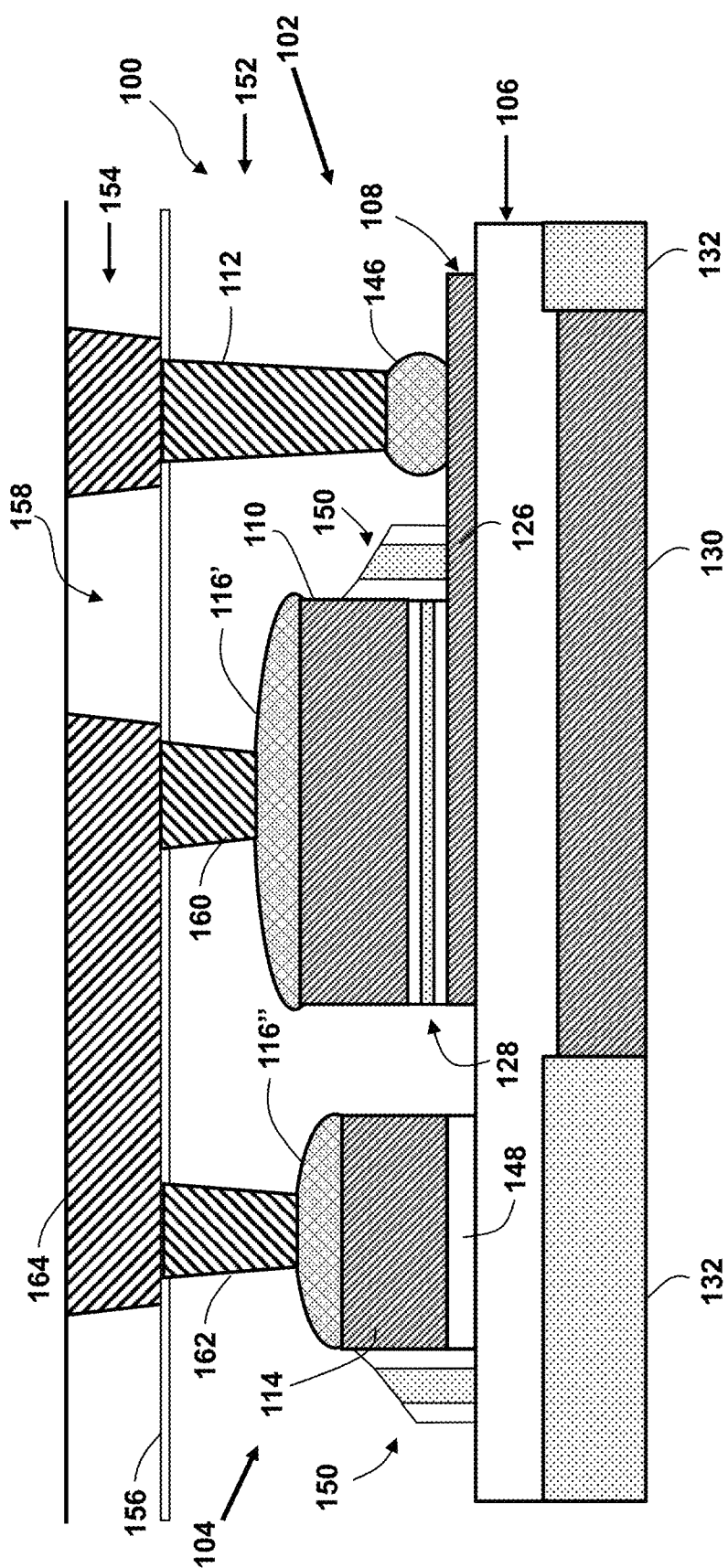
FIG. 6 is a cross-sectional view of a semiconductor device including a floating gate memory cell according to additional embodiments of the disclosure.

FIG. 6 shows a cross-sectional view of a semiconductor device 100' including a floating gate memory cell according to additional embodiments of the disclosure. The semiconductor device 100' is similar to the semiconductor device 100 described above with regard to FIGS. 3-5. One difference relates to the realization of the electrical contacting of the read/write gate 114 of the transistor device 104 to the floating gate 110 of the memory device 102. For example, instead of being directly connected via an electrode 116 as in the semiconductor device 100, the read/write gate 114 of the transistor device 104 in the semiconductor device 100' may be connected to the floating gate 110 of the memory device 102 via a metallization layer 154 (e.g., M1 layer).

The metallization layer 154 in the semiconductor device 100' may be separated from the interlayer dielectric 152 by an isolation layer 156, and may include metal contacts formed in an interlevel dielectric 158. Electrodes 116', 116" may be formed on the floating gate 110 and the read/write gate 114, respectively. Contacts 160, 162 may be formed on the electrodes 116', 116", respectively, and may be electrically coupled via a contact 164 formed in the metallization layer 154.

Figure 7:
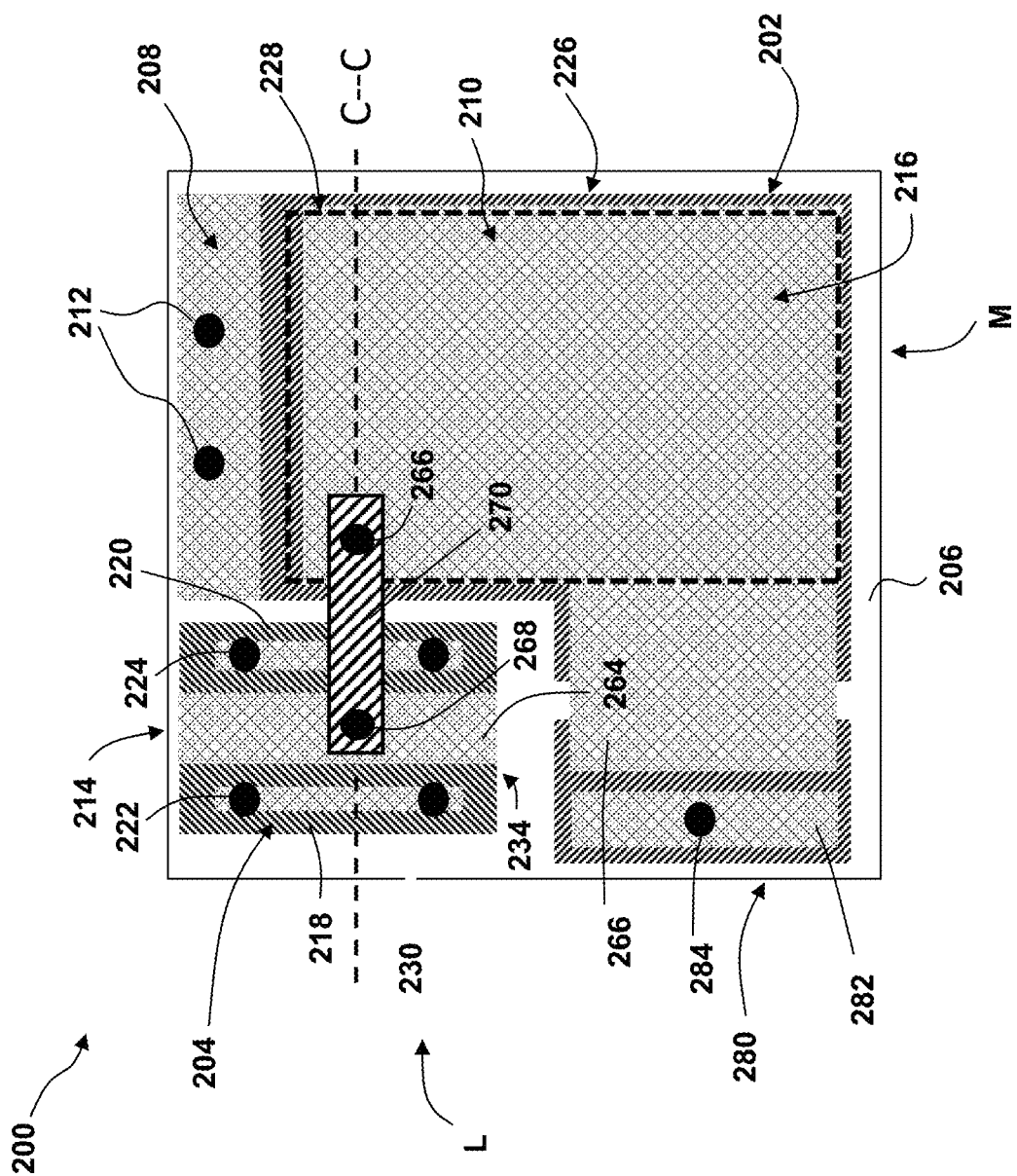
FIG. 7 is a plan view of a semiconductor device including a floating gate memory cell according to further embodiments of the disclosure.
Figure 8:
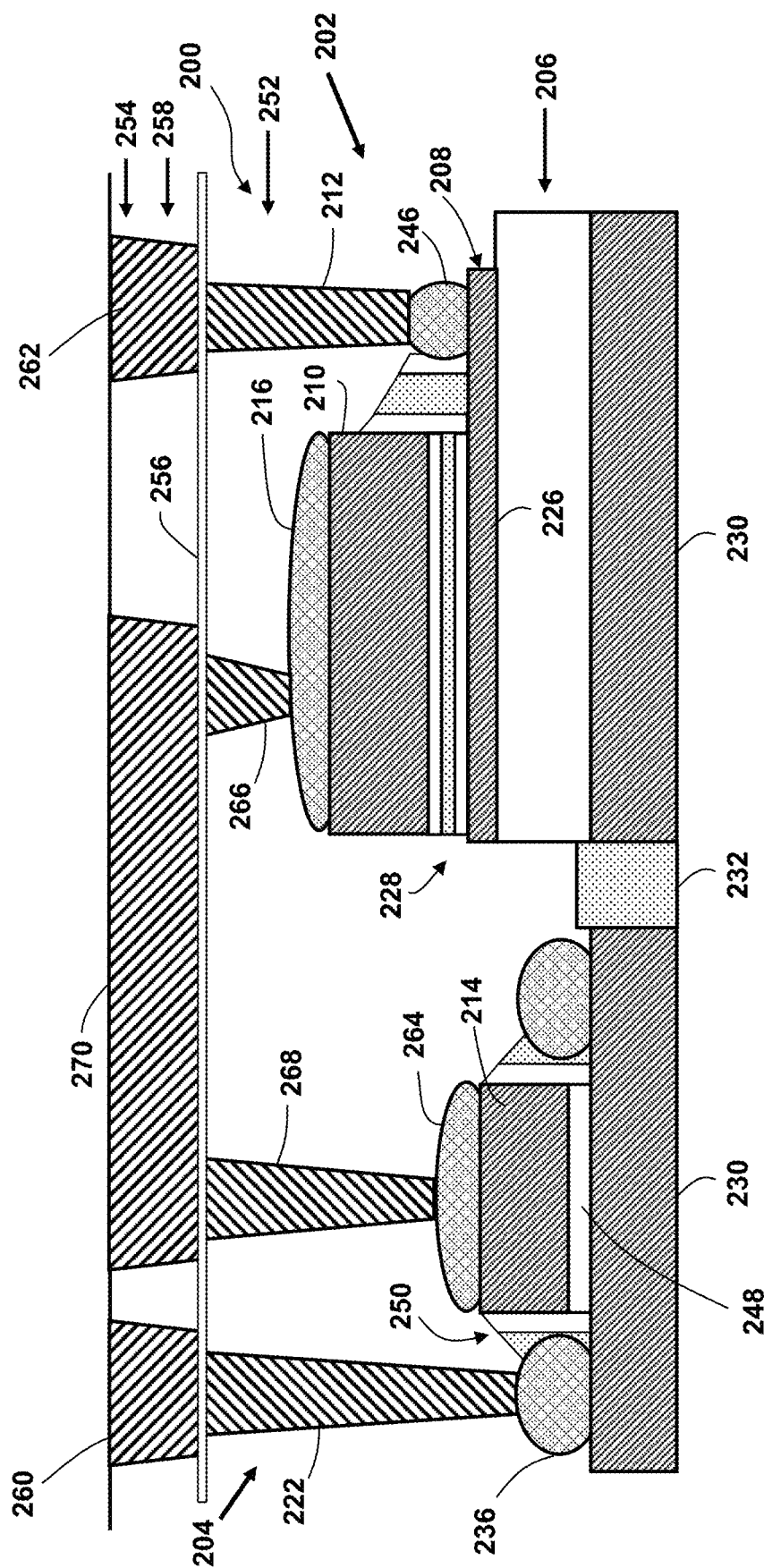
FIG. 8 is a cross-sectional view of a semiconductor device including a floating gate memory cell taken along the lines C-C of FIG. 7 according to embodiments of the disclosure.

FIG. 7 is a plan view of a semiconductor device 200 including a floating gate memory cell according to further embodiments of the disclosure. FIG. 8 is a cross-sectional view of the semiconductor device 200 taken along the lines C-C of FIG. 7 according to embodiments of the disclosure.

The device 200 may include a memory region M including a flash memory device 202 and a logic region L including a transistor device 204 (e.g., a FET) surrounded by an isolation layer that may be a BOX layer 206 of an SOI substrate. The memory device 202 may further include a control gate 208 and a floating gate 210. According to embodiments, the control gate 208 may be formed using a silicon layer 226 of an SOI substrate. The control gate 208 may be coupled to a wordline (not shown in FIG. 7) via wordline/control contacts 212. An electrode 216 may be formed on the floating gate 210.

The device 200 illustrated in FIG. 7 may further include a read/write gate 214. The read/write gate 214, which may be formed of polysilicon, may be electrically coupled to the floating gate 210 as detailed below. The transistor device 204, furthermore, may include a source region 218 and a drain region 220, which may be formed, for example, in a bulk semiconductor layer 230 layer of an SOI substrate. The source region 218 may be electrically connected to a source line 260 (FIG. 8) by source contacts 222. The drain region 220 may be electrically connected to a bitline (not shown in FIG. 7 or FIG. 8) by bitline contacts 224 (FIG. 7).

The bulk semiconductor layer 230 may include silicon, in particular, single crystal silicon. Other materials may be used to form the bulk semiconductor layer 230 such as, for example, germanium, silicon germanium, gallium phosphate, gallium arsenide, etc. The BOX layer 206 may include borophosphosilicate glass (BPSG) or an $SiO_2$-compound including boron or phosphorus. The semiconductor layer 226 may include silicon, in particular, crystalline silicon. A shallow trench isolation STI region 232 for electrical insulation may be formed in a known manner.

According to embodiments of the disclosure, a portion of the semiconductor layer 226 formed in the memory region M may be used to provide the control gate 208 of the memory device 202. Unlike in the device 100, however, the source region 218, drain region 220, and channel region 234 of the transistor device 204 may be formed in the bulk semiconductor layer 230 rather than in the semiconductor layer 226. The source region 218 and drain region 220 may be formed by appropriate doping of the bulk semiconductor layer 230 or for example by epitaxial growth of an electrode forming also a source/drain region. An electrode 236 may be provided to couple the source region 218 of the transistor device 204 to a source line 260 via a source contact 222. Similarly, an electrode 238 may be provided to couple the drain region 220 of the transistor device 204 to a bitline (not shown) via a bitline contact 224 (FIG. 7).

In the memory region M, an ONO layer 228 may be formed on the semiconductor layer 226 (the control gate 208) in the memory device 202. The ONO layer 228 may include, for example, a first oxide layer, a nitride layer, and a second oxide layer.

The floating gate 210, which may be formed, for example, of polysilicon, may be formed on the ONO layer 228. An electrode 216 may be formed on a surface of the floating gate 210. Additionally, an electrode 246 may be formed on a surface of the control gate 208. The control gate 210 may be coupled to a wordline 262 via the electrode 246 and wordline/control gate contact(s) 212.

The transistor device 204 of the semiconductor device 200 may include a gate dielectric 248 over which a read/write gate 214 is formed. The read/write gate 214 may be formed, for example, using polysilicon or other suitable material(s).

FIG. 8 also shows sidewall spacers 250 that may be formed on sidewalls of the read/write gate 214 and the floating gate 210. Further, the semiconductor device 200 shown in FIG. 3 may include an interlayer dielectric 252. The interlayer dielectric 252 may be formed of an oxide material such as silicon dioxide.

The read/write gate 214 of the transistor device 204 in the semiconductor device 200 may be connected to the floating gate 210 of the memory device 202 via a metallization layer 254 (e.g., M1 layer). The metallization layer 254 in the semiconductor device 200 may be separated from the interlayer dielectric 252 by an isolation layer 256, and may include metal contacts formed in an interlevel dielectric 258. Electrodes 216, 264 may be formed on the floating gate 210 and the read/write gate 214, respectively. Contacts 266, 268 may be formed on the electrodes 216, 264, respectively, and may be electrically coupled via a contact 270 formed in the metallization layer 254.

As depicted in FIG. 7, the device 200 may also include an erase gate 280 with corresponding electrode 282 and contact 284. The erase gate 280 is electrically coupled to the floating gate 210 via the electrode 216.

Semiconductor devices formed in accordance with embodiments of the disclosure include a floating gate memory cell that is integrated in FD-SOI using the semiconductor layer of the SOI. By forming a control gate and an active region (e.g., source, drain, channel) using the semiconductor layer of the SOI, and by forming a polysilicon-only floating gate, the number of additional processing steps required to incorporate the floating gate memory cell into a standard CMOS process flow is greatly reduced. In addition, by forming the floating gate memory cell (e.g., control gate, ONO layer, floating gate) before CMOS device formation (e.g., doping, annealing, etc.), the impact on the CMOS process flow is further minimized. Back gate capacitive coupling is also reduced compared to related floating gate memory devices due, for example, to shielding provided by the control gate.

Various memory array layouts including floating gate memory cells according to embodiments are illustrated in FIGS. 9-12.

Figure 9:
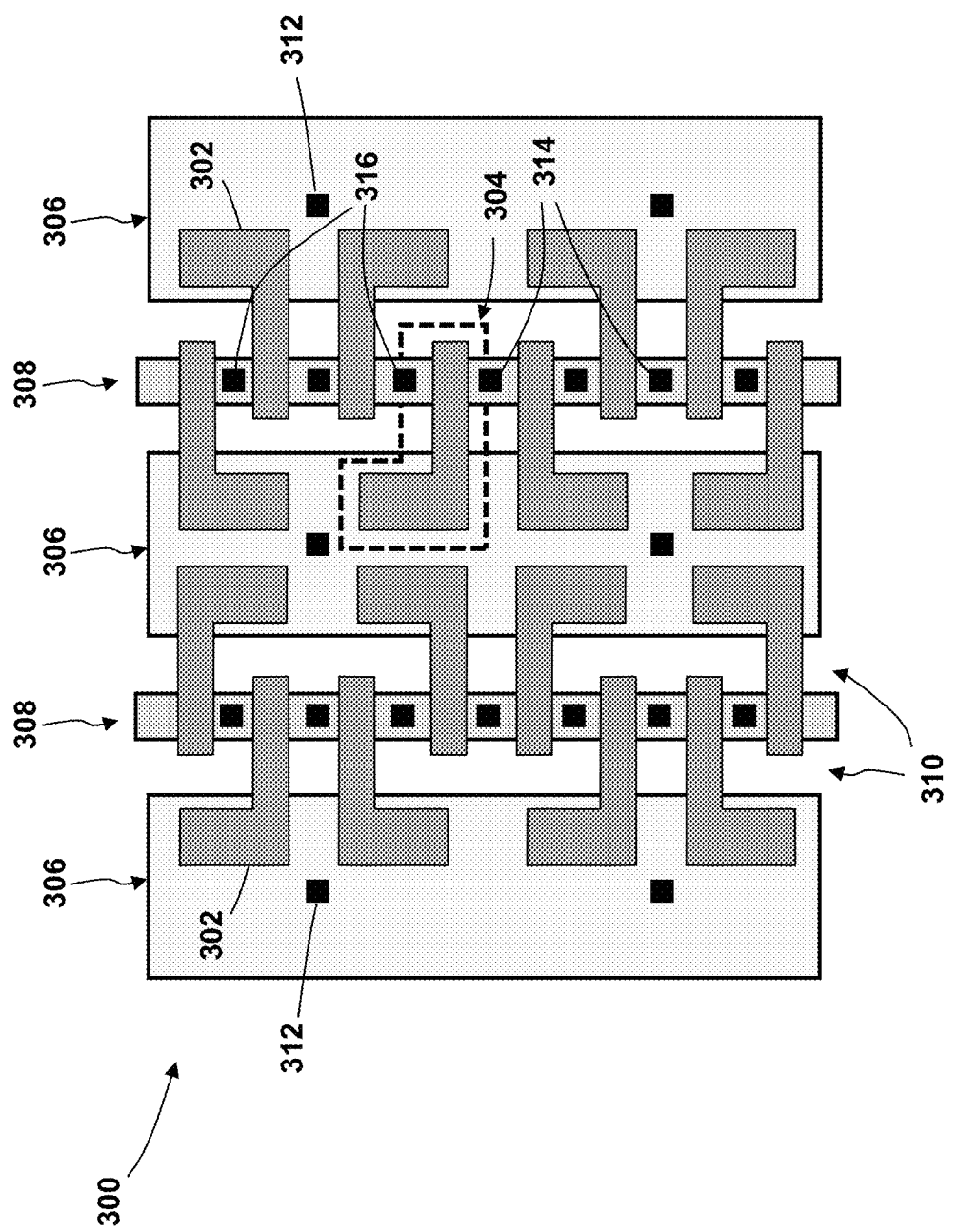
FIG. 9 depicts a 1T (1 transistor) memory array layout according embodiments of the disclosure.

FIG. 9 depicts a 1T (1 transistor) memory array layout 300 including L-shaped memory cell gates 302 according embodiments of the disclosure. The layout 300 includes a plurality of floating gate memory cells 304, for example as shown and described with regard to FIGS. 3-5. Each L-shaped gate 302 may extend between and electrically couple a continuous control gate 306 formed in the silicon layer of an SOI substrate and an active (read/write gate) area 308 (which may be formed in the silicon layer or bulk semiconductor layer of an SOI substrate). The L-shaped memory cell gates 302 connecting the control gates 306 and the active areas 308 may be provided via a direct polysilicon link, through a metallization layer (e.g., M1), by a metal (e.g., tungsten) contact bar (CABAR), and the like. The control gates 306 may be separated from the active areas 308 by STI regions 310. Wordline/control contacts 312 may be provided on the control gates 306 and may be shared between a plurality of memory cells 304. Bitline contacts 314 and sourceline contacts 316 may be provided in the active area 308 on opposing sides of each L-shaped gate 302. The bitline contacts 314 and sourceline contacts 316 may be shared by adjacent memory cells 304.

Figure 10:
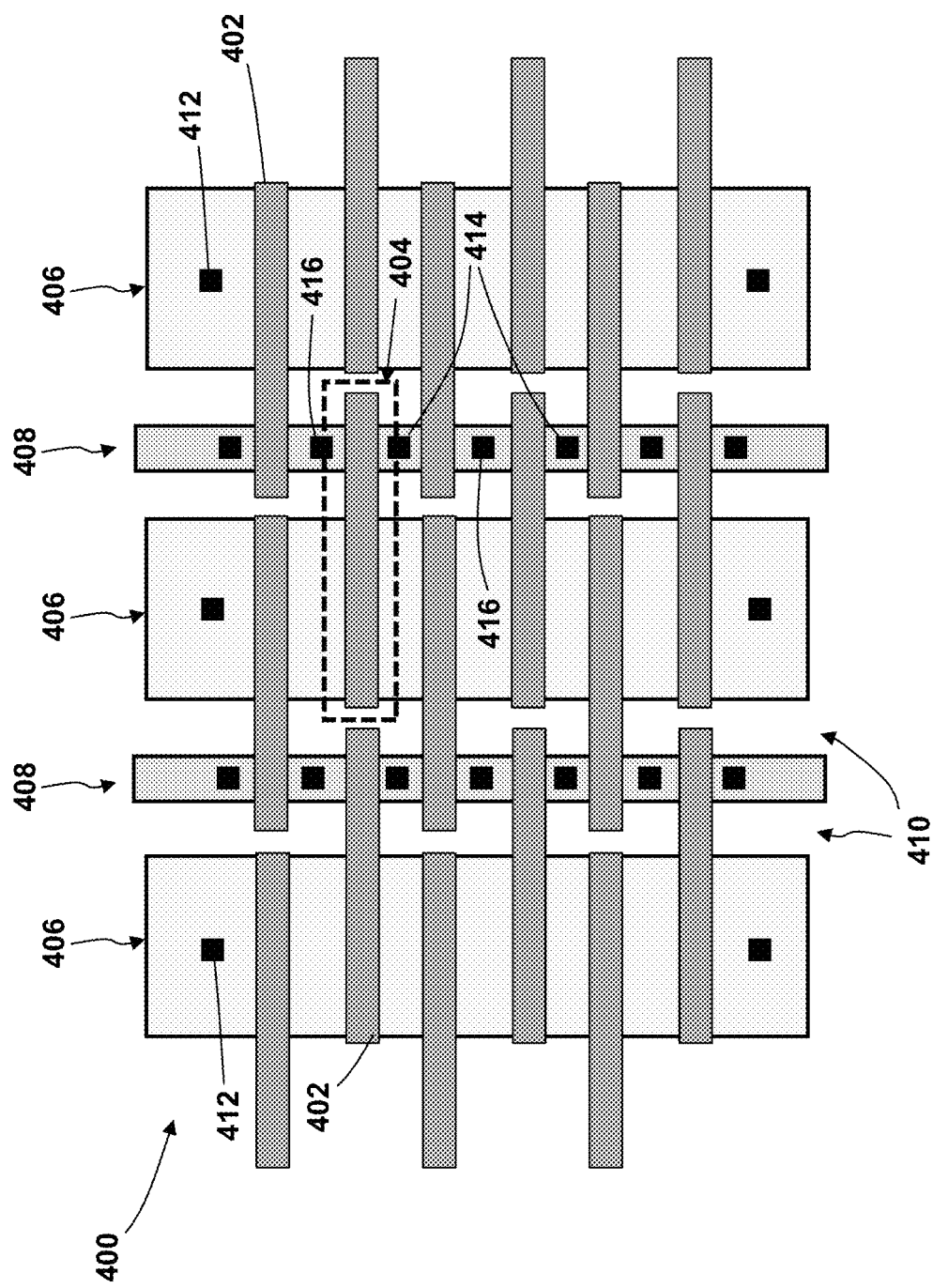
FIG. 10 depicts a 1T memory array layout according to additional embodiments of the disclosure.

FIG. 10 depicts a 1T (1 transistor) memory array layout 400 including straight memory cell gates 402 according embodiments of the disclosure. The layout 400 includes a plurality of floating gate memory cells 404, for example as shown and described with regard to FIGS. 3-5. Each straight gate 402 extends between and electrically couples a continuous control gate 406 formed in the silicon layer of an SOI substrate and an active (read/write gate) area 408 (which may be formed in the silicon layer or bulk semiconductor layer of an SOI substrate). The straight memory cell gates 402 connecting the control gates 406 and an active areas 408 may be provided via a direct polysilicon link, through a metallization layer (e.g., M1), by a metal (e.g., tungsten) CABAR, and the like. The control gates 406 are separated from the active areas 408 by STI regions 410. Wordline/control contacts 412 are provided on the control gates 406 and may be shared between a plurality of memory cells 404. Bitline contacts 414 and sourceline contacts 416 are provided in the active area 408 on opposing sides of each straight gate 402. The bitline contacts 414 and sourceline contacts 416 may be shared by adjacent memory cells 404.

Figure 11:
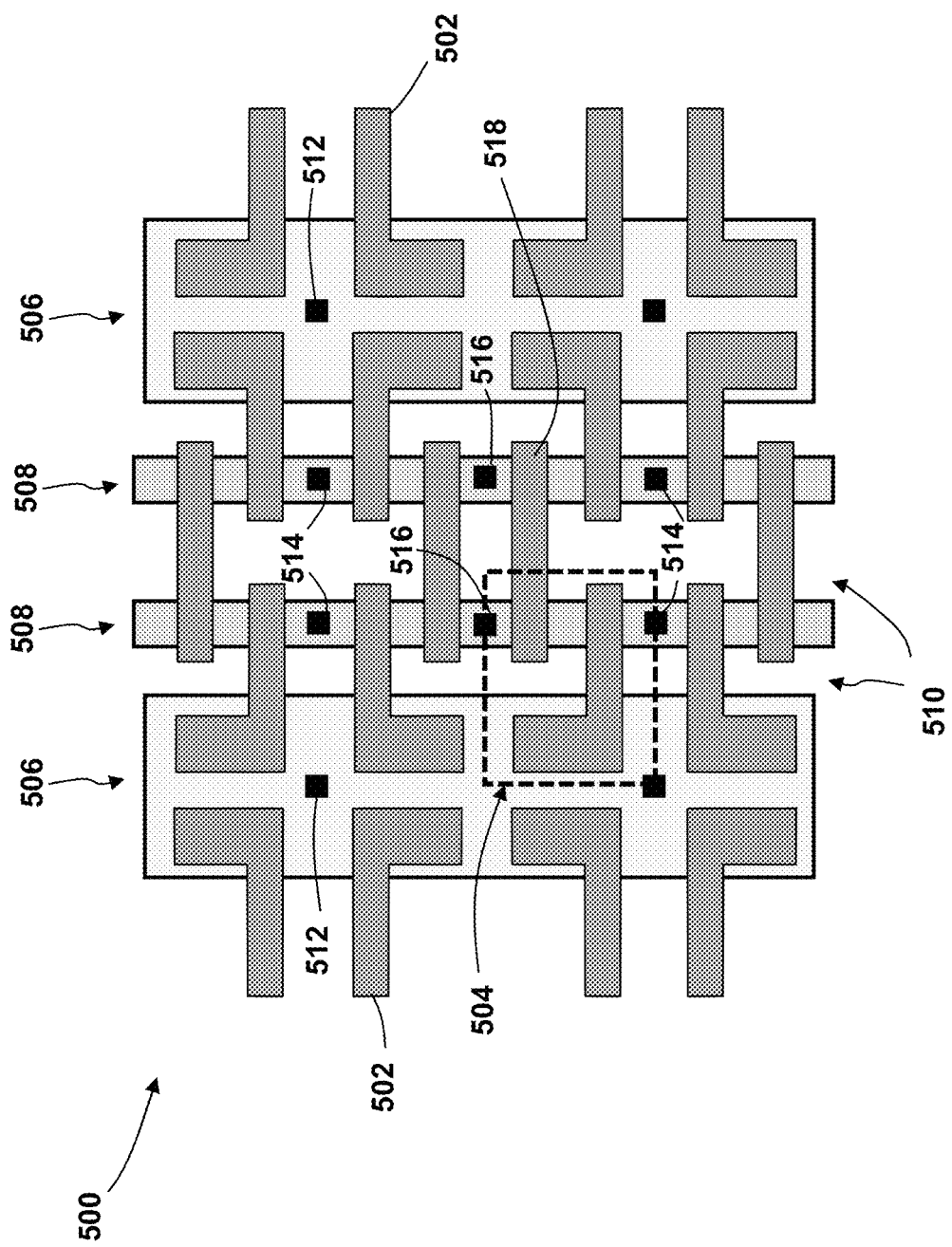
FIG. 11 depicts a 2T (2 transistor) memory array layout according embodiments of the disclosure.

FIG. 11 depicts a 2T (2 transistor) memory array layout 500 including L-shaped memory cell gates 502 according to additional embodiments of the disclosure. The layout 500 includes a plurality of floating gate memory cells 504. Each L-shaped gate 502 may extend between and electrically couple a continuous control gate 506 formed in the silicon layer of an SOI substrate and a respective active (read/write gate) area 508 (which may be formed in the silicon layer or bulk semiconductor layer of an SOI substrate). The L-shaped gates 502 connecting the control gates 506 and active areas 508 may be provided via a direct polysilicon link, through a metallization layer (e.g., M1), by a metal (e.g., tungsten) contact bar (CABAR), and the like. The control gates 506 may be separated from the active areas 508 by STI regions 510. Wordline/control contacts 512 may be provided on the control gates 506 and may be shared between a plurality of memory cells 504. Bitline contacts 514 and sourceline contacts 516 may be provided in the active area 508. The bitline contacts 514 and sourceline contacts 516 may be shared by adjacent memory cells 504. A plurality of select gates 518 connect the active areas 508 and form a portion of each memory cell 504.

Figure 12:
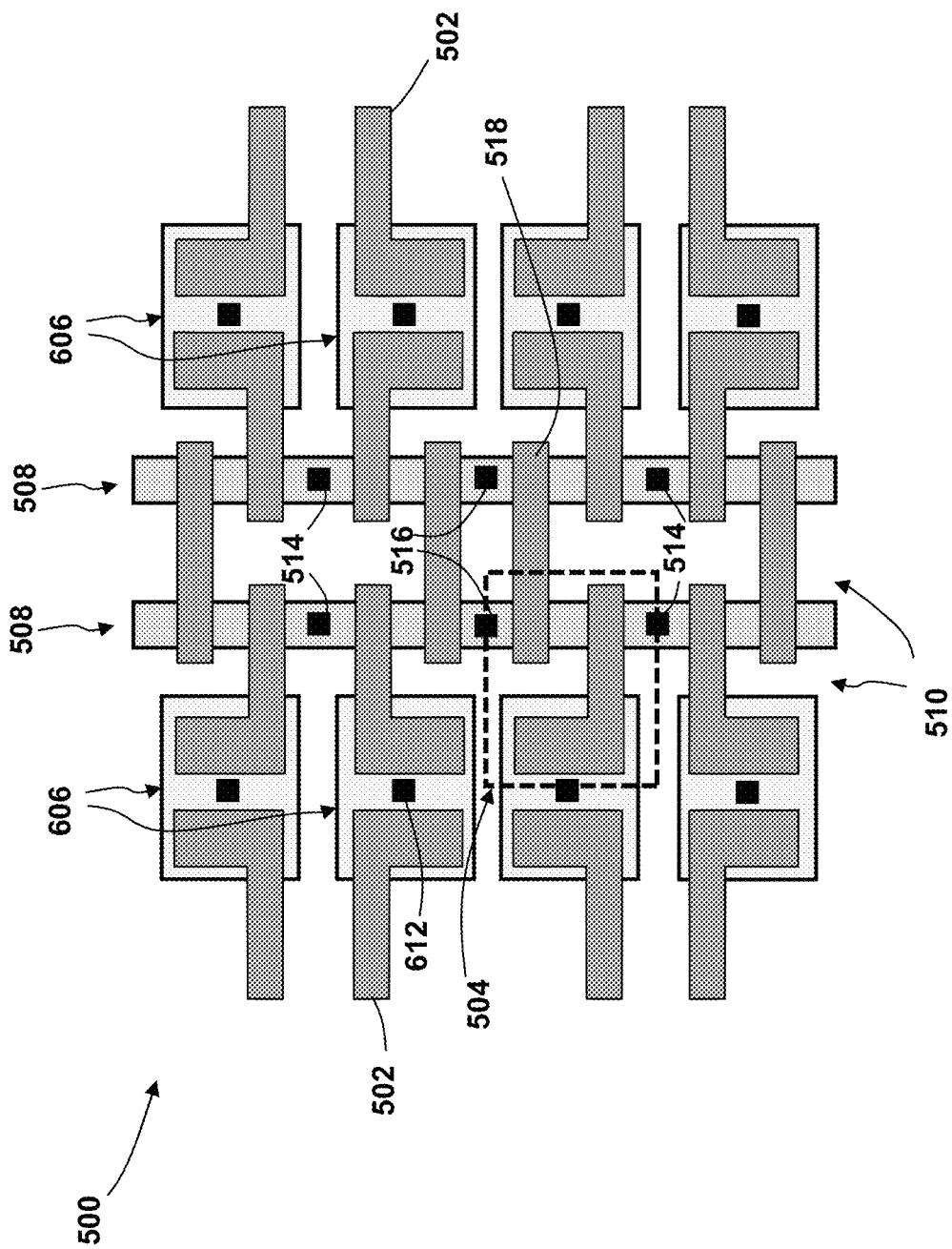
FIG. 12 depicts a 2T memory array layout according to further embodiments of the disclosure.

FIG. 12 depicts a 2T (2 transistor) memory array layout 600 including L-shaped memory cell gates 602 according embodiments of the disclosure. The layout 600 is similar to the layout 500 shown in FIG. 11. One difference is that separate control gates 606 are used instead of continuous control gates 506, where each control gate 606 includes a respective wordline/control contact 612.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of manufacturing a floating gate memory cell, comprising:
    forming a memory device on a silicon-on-insulator (SOI) substrate, the SOI substrate comprising a semiconductor bulk substrate, a buried oxide layer formed on the semiconductor bulk substrate, and a semiconductor layer formed on the buried oxide layer, wherein forming the memory device comprises:
        forming a control gate in the semiconductor layer of the SOI substrate;
        forming an insulating layer on the control gate; and
        forming a floating gate on the insulating layer; and
    forming a transistor device on the SOI substrate, wherein an active region of the transistor device is formed in the bulk semiconductor layer of the SOI substrate.

2. The method according to claim 1, wherein the insulating layer comprises an oxide-nitride-oxide (ONO) layer.

3. The method according to claim 1, further comprising:
    forming a read/write gate of the transistor device; and
    electrically connecting the floating gate of the memory device to the read/write gate of the transistor device.

4. The method according to claim 3, wherein electrically connecting the floating gate of the memory device to the read/write gate of the transistor device further comprises:
    forming a contact in a metallization layer; and
    electrically connecting an electrode on the floating gate of the memory device and an electrode on the read/write gate of the transistor device via the contact in the metallization layer.

5. A floating gate memory cell, comprising:
    a silicon-on-insulator (SOI) substrate, the SOI substrate comprising a semiconductor bulk substrate, a buried oxide layer formed on the semiconductor bulk substrate, and a semiconductor layer formed on the buried oxide layer;
    a memory device, comprising:
        a control gate formed in the semiconductor layer of the SOI substrate;
        an insulating layer formed on the control gate; and
        a floating gate formed on the insulating layer; and a transistor device electrically connected to the memory device, wherein an active region of the transistor device is formed in the bulk semiconductor layer of the SOT substrate.

6. The floating gate memory cell according to claim 5, further comprising an erase electrode for erasing the memory device, wherein the erase electrode may be formed in the semiconductor layer or as a separate electrode.

7. The floating gate memory cell according to claim 5, wherein the transistor device further comprises:
 a gate dielectric layer formed on the bulk semiconductor layer of the SOI substrate; and
 a read/write gate formed on the gate dielectric layer.

8. The floating gate memory cell according to claim 7, further comprising an electrical connection between the floating gate of the memory device and the read/write gate of the transistor device.

9. The floating gate memory cell according to claim 8, wherein the electrical connection comprises:
 a metal contact formed in a metallization layer;
 an electrode formed on the floating gate of the memory device;
 an electrode formed on the read/write gate of the transistor device;
 a contact formed on the floating gate electrode and electrically contacting the metal contact in the metallization layer; and
 a contact formed on the read/write and electrically contacting the metal contact in the metallization layer.

10. A memory array, comprising:
 a plurality of floating gate memory cells, each floating gate memory cell comprising:
  a silicon-on-insulator (SOI) substrate, the SOI substrate comprising a semiconductor bulk substrate, a buried oxide layer formed on the semiconductor bulk substrate, and a semiconductor layer formed on the buried oxide layer;
  a memory device, comprising:
   a control gate formed in the semiconductor layer of the SOI substrate;
   an insulating layer formed on the control gate; and
   a floating gate formed on the insulating layer; and
  an active area electrically connected to the memory device, wherein the active area is formed in the bulk semiconductor layer of the SOI substrate,
  wherein each floating gate memory cell further comprises a gate electrically connecting the control gate of the memory device to the active area.

11. The memory array according to claim 10, wherein the gate electrically connecting the control gate of the memory device to the active area comprises an L-shaped gate or a straight gate.

12. The memory array according to claim 10, wherein each floating gate memory cell further comprises a wordline/control contact connected to the control gate, and a sourceline contact and bitline contact connected to the active area.

13. The memory array according to claim 12, wherein a set of the floating gate memory cells share the same wordline/control contact.

14. The memory array according to claim 12, wherein adjacent floating gate memory cells share the same sourceline contact or the same bitline contact.

* * * * *